(12) United States Patent
Chen (10) Patent No.: US 7,217,959 B2
(45) Date of Patent: May 15, 2007

(54) SINGLE-CHIP WHITE LIGHT EMITTING DEVICE

(75) Inventor: Cheng Chuan Chen, Tainan County (TW)

(73) Assignee: Genesis Photonics Inc., Tainan (TW)

( * ) Notice: Subject to any disclaimer, the term of this patent is extended or adjusted under 35 U.S.C. 154(b) by 179 days.

(21) Appl. No.: 11/064,675

(22) Filed: Feb. 23, 2005

(65) Prior Publication Data
US 2005/0194608 A1    Sep. 8, 2005

(30) Foreign Application Priority Data
Mar. 2, 2004  (TW) .............................. 93105430 A (51) Int. Cl.
H01L 33/00 (2006.01)
H01L 27/15 (2006.01)
H01L 31/12 (2006.01)

(52) U.S. Cl. .................... 257/100; 257/79; 257/103
(58) Field of Classification Search ........... 257/79–103
See application file for complete search history.

(56) References Cited

U.S. PATENT DOCUMENTS

| | | | |
|---|---|---|---|
| 6,069,440 A | 5/2000 | Shimizu et al. | |
| 6,337,536 B1 | 1/2002 | Matsubara et al. | |
| 6,563,139 B2 | 5/2003 | Hen | |
| 6,580,097 B1 | 6/2003 | Soules et al. | |
| 6,592,780 B2 | 7/2003 | Höhn et al. | |
| 6,596,195 B2 | 7/2003 | Srivastava et al. | |
| 7,005,667 B2 * | 2/2006 | Chen et al. | 257/103 |
| 2005/0230693 A1 * | 10/2005 | Chen | 257/89 |

FOREIGN PATENT DOCUMENTS

JP   2001-0284-58 A   1/2001

\* cited by examiner

*Primary Examiner*—Cuong Nguyen
(74) *Attorney, Agent, or Firm*—Christensen O'Connor Johnson Kindness PLLC (57) ABSTRACT

A single-chip white light emitting device, including: a substrate, a buffer layer, a first conductive cladding layer, a second conductive cladding layer, at least one broad-spectrum blue-complimentary light quantum dot emitting layer and at least one blue light emitting layer. The buffer layer is disposed over the substrate. The first conductive cladding layer is disposed over the buffer layer. The broad-spectrum blue-complimentary light quantum dot emitting layer is disposed between the first conductive cladding layer and the second conductive cladding layer. The blue-complimentary light quantum dot emitting layer includes plural quantum dots with an uneven character distribution, so as to increase FWHM of emission wavelength of the quantum dot emitting layer. The blue light emitting layers is disposed between the first and second conductive cladding layers, such that mixing of blue light and blue-complimentary light would generate white light. According to the single-chip white light emitting device of this invention, a single LED laminar structure is provided therein with a broad-spectrum blue-complimentary light quantum dot emitting layer and a blue light emitting layer, which are mixed to form an $Al_{(1-x-y)}In_yGa_xN$ single-chip white light emitting device with a high CRI, and high emission and are capable of color temperature modulation.

22 Claims, 11 Drawing Sheets

SINGLE-CHIP WHITE LIGHT EMITTING DEVICE

FIELD OF THE INVENTION

The invention relates to a white light emitting device, particularly to a single-chip white light emitting device.

BACKGROUND OF THE INVENTION

The rapid development of nitrides emitting devices in recent years has resulted in high demands in high brightness LED. Along with the significant enhancement in emission efficiency, high interest and expectation are given to the use of high brightness LED to serve as a white light source. Presently, the structures using high brightness LED to serve as white light sources include the followings:

The first structure is developed by Nichia Kagaku Kogyo Kabushiki Kaisha, where yellow fluorescent powder (YAG: Ce; $Y_3Al_5O_{12}$: $Ce^{3+}$) is added into blue LED to generate mixed white light (with reference to U.S. Pat. No. 6,069, 440). Such a structure provides a white light emitting device that is of the lowest cost among the commercially available white light emitting devices. However, with the blue halo effect, the reducing reliability and low light conversion efficiency of fluorescent powder, and the limited characteristics of fluorescent powder, such a structure cannot attain white light emitting devices with high color saturation, high luminous intensity, high reliability and capable of various color temperature modulation.

The second structure was recently developed and aimed at improving the poor color rendering index (CRI) of the aforementioned white light source, where ultraviolet A (UVA) was excited to generate red, green and blue fluorescent powder, for producing white light sources with a high CRI (with reference to U.S. Pat. Nos. 6,592,780; 6,580,097 and 6,596,195). Such a structure involves the drawbacks of poor reliability in the mixture of RGB fluorescent powder. In addition, the light source generated from exciting UVA cannot serve as a mixed light source, thereby resulting in an even lower luminous intensity. Furthermore, such a structure further needs to overcome the safety concerns of resin deterioration and UVA leakage during the packaging process.

The third structure is one of a high cost structure, which joins a plurality of emitting devices to generate high brightness thereby attaining a white light source with an excellent CRI (with reference to U.S. Pat. No. 6,563,139). However, the commercially available package attained from such a structure is limited to that including red-orange-yellow light AlGaInP LED and nitrides blue LED with a wavelength greater than 580 nm. As such, the drawbacks of such a structure include the high cost involved in packaging multiple chips, and difficulty involved in packaging the two LED of different characteristics, such as thermal stability, driving voltages and material reliability.

In addition, others also suggest the use of plural quantum wells with different wave bands in a single chip to directly generate white light (with reference to JP2001-028458). Since the use of quantum wells to serve as an AlGaInP emitting layer cannot attain wave bands with high emission efficiency, such as a wavelength greater than 550 nm, and the emission bandwidth is relative to the emission efficiency. Thus, the drawback of significantly reduced emission efficiency of the quantum well emitting layer will be observed upon increasing its emission bandwidth. Thus, quantum well emitting layer cannot only be used to attain good emitting efficiency under a narrow-bandwidth wavelength. Accordingly, the process for manufacturing such a device and the emission efficiency of such a device cannot meet the performance demands of commercial white light that requires high intensity, a high CRI, and is capable of color temperature modulation.

A further alternative is to use an $Al_{(1-x-y)}In_yGa_xN$ blue light chip to excite AlGaInP for generating yellow light that is then mixed to generate a white light source. However, the low intensity and narrow bandwidth of the yellow light result in poor lighting effects. Yet another alterative is to use ZnSe as the luminescent material (with reference to U.S. Pat. No. 6,337,536). However, the reliability, color saturation, luminous intensity of such is inferior to white light emitting devices of the $Al_{(1-x-y)}In_yGa_xN$ type.

Thus, there has been a need for a novel white light emitting device capable of resolving the above drawbacks.

SUMMARY OF THE INVENTION

The object of this invention is to provide a single-chip white light emitting device, comprising: a substrate, a buffer layer, a first conductive cladding layer, a second conductive cladding layer, at least one broad-spectrum blue-complimentary light quantum dot emitting layer, and at least one blue light emitting layer. The buffer layer is disposed over the substrate. The first conductive cladding layer is disposed over the buffer layer and supplies electrons. The broad-spectrum blue-complimentary light quantum dot emitting layer is disposed between the first and second conductive cladding layers. The blue-complimentary light quantum dot emitting layer includes plural quantum dots with an uneven character distribution, so as to increase FWHM of emission wavelength of the quantum dot emitting layer. The blue light emitting layer is disposed between the first and second conductive cladding layer, such that mixing of blue light blue-complimentary light would generate white light.

In the single-chip white light emitting device of this invention, a single LED laminar structure is provided with a broad-spectrum blue-complimentary light quantum dot emitting layer and a blue light emitting layer, such that mixing of the two would attain an $Al_{(1-x-y)}In_yGa_xN$ single-chip white light emitting devices with a high CRI index, high color saturation, high luminous intensity, high reliability and capable of various color temperature modulation.

The broad-spectrum blue-complimentary light quantum dot emitting layer has an emission wavelength at a maximum luminous intensity falling within a range of 510~670 nm, FWHM within a range of 20~200 nm. The broad-spectrum blue-complimentary light quantum dot emitting layer is then mixed with an $Al_{(1-x-y)}In_yGa_xN$ blue light emitting layer within the same chip structure to attain a single-chip white light emitting device with a high CRI index, high luminous intensity, high reliability and capable of various color temperature modulation. Since the broad-spectrum emission bandwidth covers the visible spectrum that is most sensitive to human eyes, this invention significantly enhances the luminous intensity of the white light. The distribution of the broad-spectrum also further increases the CRI index and enhances the various color temperature modulation.

Since this invention is related to the growth of a broad-spectrum blue-complimentary light spectrum emitting layer directly over a single chip, this invention is distinguishable from the prior art in that the prior art implements a blue chip to excite blue-complimentary fluorescent powder for forming the desired blue-complimentary light spectrum, which is then mixed with blue light to generated white light. Thus, the single-chip white light emitting device according to this invention is featured with emission efficiency that is far superior over that of the prior art coated with fluorescent powder, and a luminous intensity attenuation that is far superior over that using blue-complimentary fluorescent powder.

In the packaging process, since a single chip is required for packing the single-chip white light emitting device into a white light emitting device according to this invention, it is unnecessary to adopt the multi-chip packaging process. Thus, the single-chip white light emitting device according to this invention is far superior over that the prior art in terms of reliability, emission efficiency, CRI index, color temperature modulation capability as well as characteristics relating to driving voltage, thermal stability, and ESD impedance characteristics, thereby significantly reducing the packaging cost and enhancing the reliability of the packaged device.

Accordingly, the solid state white light emitting device of this invention may be implemented to serve as or to replace the white light emitting device that is available in the commercial market, such as the white backlight of portable electronic products, vehicular lighting, landscape lighting, decorative lighting, and handheld lighting apparatus.

In addition, to further enhance the CRI index and the color temperature modulation capability in terms of red light, the single-chip white light emitting device according to this invention may be added with red fluorescent powder of an appropriate amount to be packaged together for attaining a white light emitting device with three wavelength spectrums. The addition of the red fluorescent powder mainly intends to enhance the weaker color temperature modulation capability and the CRI in the event that white light is subject to red objects. The amount to be added may be less than that for blue-complimentary fluorescent powder, which is usually implemented in the prior art. Thus, the high CRI single-chip white light emitting device according to this invention may still be featured with the advantages of high reliability, high luminous intensity, and low packaging cost.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Reference is made to the accompanied drawings for explaining the embodiments of LED and solid state white light emitting devices according to this invention embodiment. In the drawings, identical or similar parts are identified by identical or related reference numerals. In addition, the drawings are for illustrative purpose only, where the dimensions and proportions of the laminar structure as illustrated may differ from the dimensions of the actual laminar structure.

Figure 1:
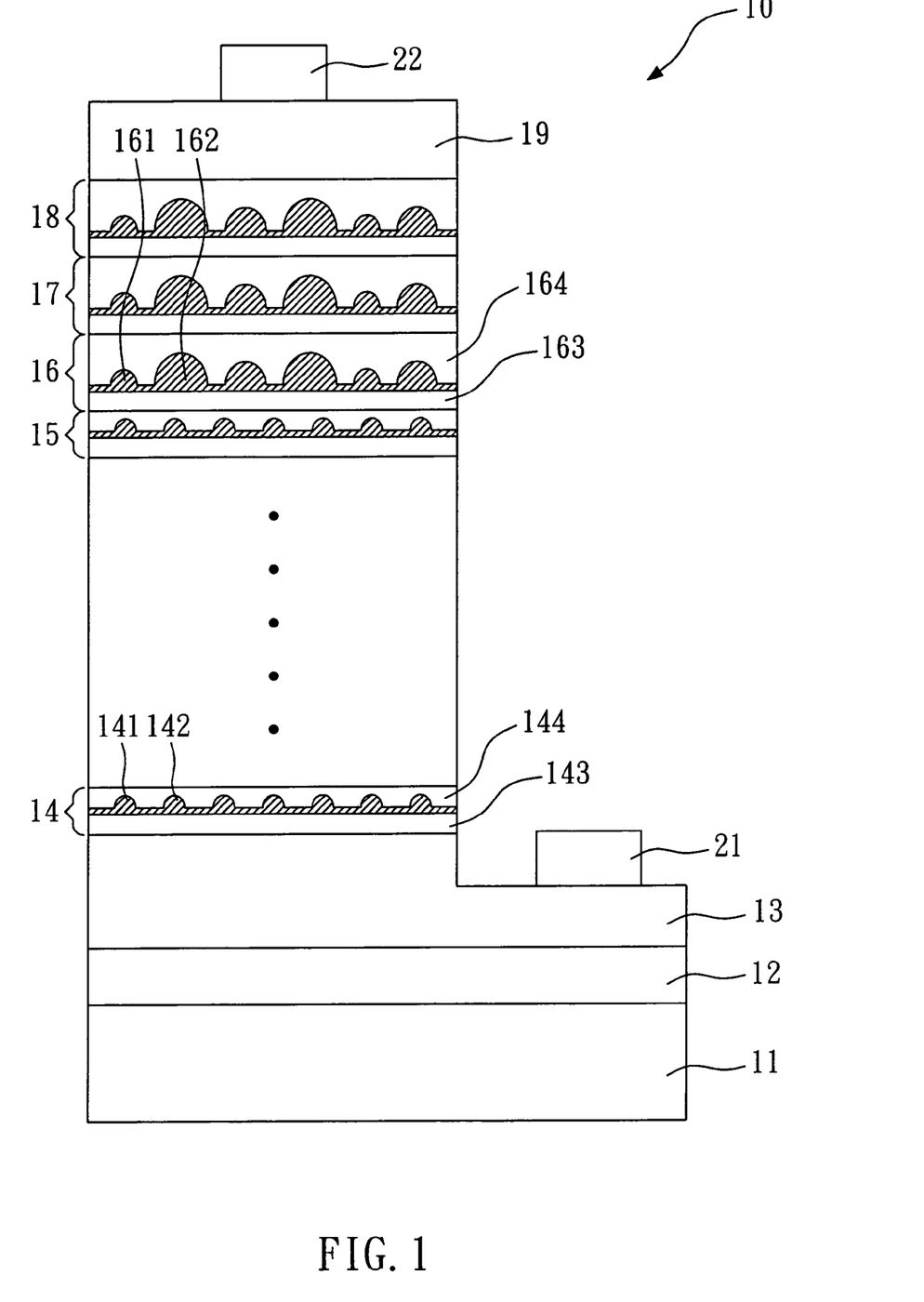
FIG. 1 is a schematic view illustrating the laminar structure of a single-chip white light emitting device according to a first embodiment of this invention.

FIG. 1 is a schematic view illustrating the laminar structure of a single-chip white light emitting device 10 according to a first embodiment of this invention. The single-chip white light emitting device 10 comprises: a substrate 11, a buffer layer 12, a first conductive cladding layer 13, seven blue light quantum dot emitting layer 14, 15, three broad-spectrum blue-complimentary light quantum dot emitting layers 16, 17, 18 and a second conductive cladding layer 19. The single-chip white light emitting device 10 further comprises two electrodes 21, 22 to be connected to an external power source. The buffer layer 12 is disposed over the substrate. The first conductive cladding layer 13 is disposed over the buffer layer 12. The first conductive cladding layer 13 may be an N-type cladding layer and serves to supply electrons. The second conductive cladding layer 19 is disposed over he quantum dot emitting layer 18. The first conductive cladding layer 19 may be a P-type cladding layer and serves to supply holes. The buffer layer 12, the first conductive cladding layer 13 and the second conductive cladding layer 19 are all laminations made of $Al_{(1-x-y)}In_yGa_xN$.

Figure 2:
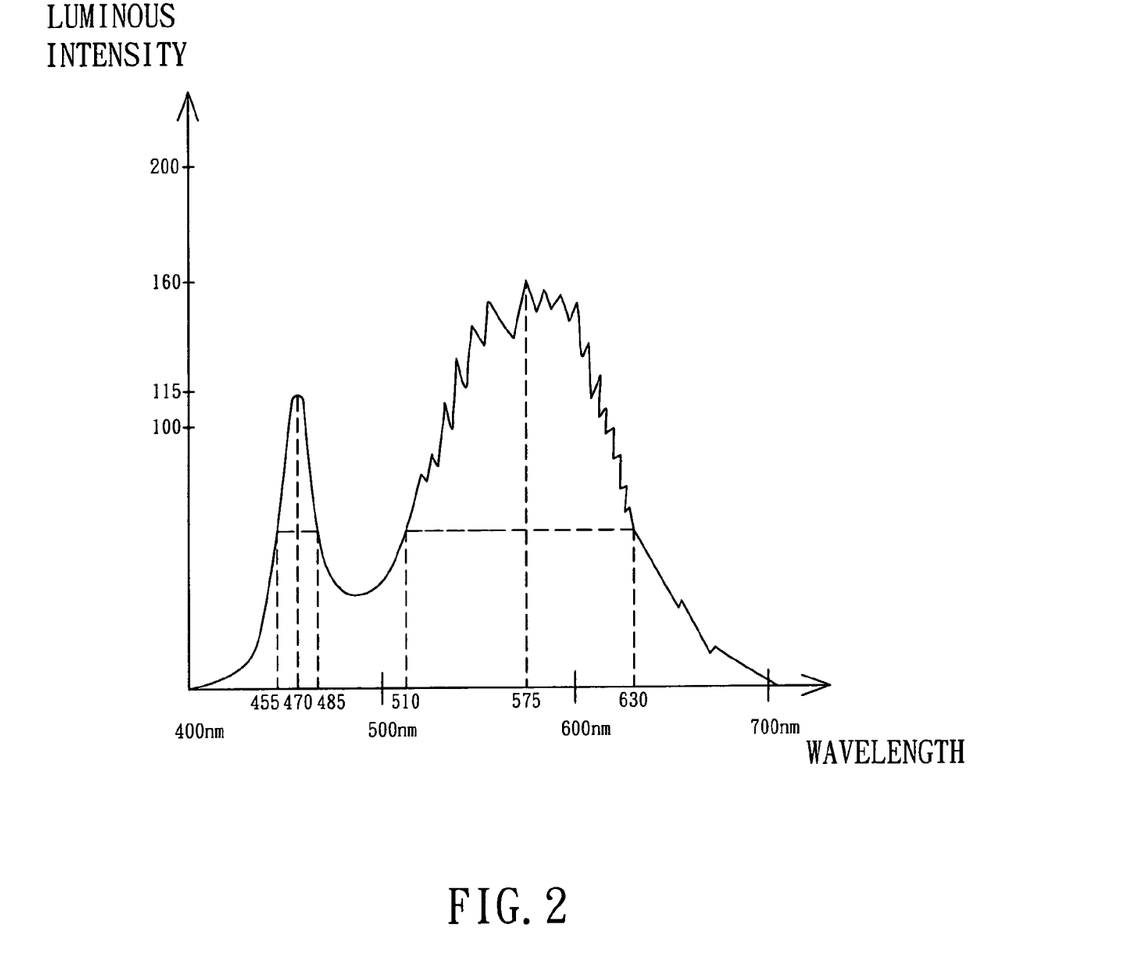
FIG. 2 is a graph illustrating the luminous intensity and bandwidth distribution of the single-chip white light emitting device according to the first embodiment of this invention.

The seven blue light quantum dot emitting layer 14, 15 are sequentially disposed over the first conductive cladding layer 13. As exemplified by the blue light quantum dot emitting layer 14, the blue light quantum dot emitting layer 14 includes plural quantum dots 141 and 142. The quantum dots are not featured with broad-spectrum characteristics as they have similar dimensions. As shown in FIG. 2, the seven $Al_{(1-x-y)}In_yGa_xN$ blue light quantum dot emitting layers 14, 15 each have a maximum luminous intensity of 115.

As exemplified by the blue light quantum dot emitting layer 14, the quantum dot emitting layer 14 further comprises: a first barrier layer 143 and a second barrier layer 144. The first barrier layer 143 is disposed under the quantum dots 141, 142. The second barrier layer 144 is disposed over the quantum dots 141, 142. The first barrier layer 143 and second barrier layer 144 are both laminations made of $Al_{(1-x-y)}In_yGa_xN$. The first barrier layer 143 and second barrier layer 144 each have an energy band gap that is greater than an energy band gap of the quantum dots 141, 142.

The blue light quantum dot emitting layer 15 is disposed thereover with three sequentially arranged broad-spectrum blue-complimentary light quantum dot emitting layers 16, 17 and 18. Each broad-spectrum blue-complimentary light quantum dot emitting layer includes plural quantum dots. As exemplified by the broad-spectrum blue-complimentary light quantum dot emitting layer 16, the broad-spectrum blue-complimentary light quantum dot emitting layer 16 includes plural quantum dots 161, 162, where each layer includes quantum dots of different dimensions to result in an uneven character distribution of the quantum dots, so as to increase FWHM of the emission wavelength of the quantum dot emitting layers 16, 17, 18.

With reference to FIG. 2, the broad-spectrum blue-complimentary light quantum dot emitting layers are implemented in generating yellow light, where their maximum luminous intensity is manipulated to be 160, their emission wavelength to be 575 nm, and their FWHM (Full Width—Half Maximum, that is, the wavelength bandwidth at an intensity of 0.5) to be 120 nm (a bandwidth of 510~630 nm) so as to attain a broad-spectrum. According to the single-chip white light emitting device of this invention, a single LED laminar structure is provided with broad-spectrum blue-complimentary light quantum dot emitting layers and a blue light emitting layer, such that mixing of the two would attain an $Al_{(1-x-y)}In_yGa_xN$ single-chip white light emitting devices with a high CRI index, high color saturation, high luminous intensity and capable of various color temperature modulation.

The FWHM of the emission wavelength of the quantum dot emitting layer may be manipulated by the dimensions of the quantum dots or the indium content in the quantum dots. Accordingly, the uneven character distribution of the quantum dots may be achieved by manipulating the dimensions of the quantum dots or indium content within the quantum dots so as to feature the layer with a broad-spectrum. The technical features of featuring the emitting layer with broad-spectrum characteristics by manipulating the uneven character distribution of the quantum dots have been disclosed in the co-pending patent application entitled "Broad-spectrum $Al_{(1-x-y)}In_yGa_xN$ Light Emitting Diodes and Solid State White Light Emitting Devices."

As described above, in the single-chip white light emitting device of this invention, a single LED laminar structure is provided with broad-spectrum blue-complimentary light quantum dot emitting layers and a blue light emitting layer, such that mixing of the two would generate white light. According to this invention, the first embodiment adopts a laminar structure having seven blue light quantum dot emitting layers and three broad-spectrum blue-complimentary light quantum dot emitting layers. However, this invention is not limited to the adoption of such a laminar structure for the quantum dot emitting layers. In the laminar structure of the first embodiment, the number of the blue light quantum dot emitting layers may be less than or equal to seven.

Figure 3:
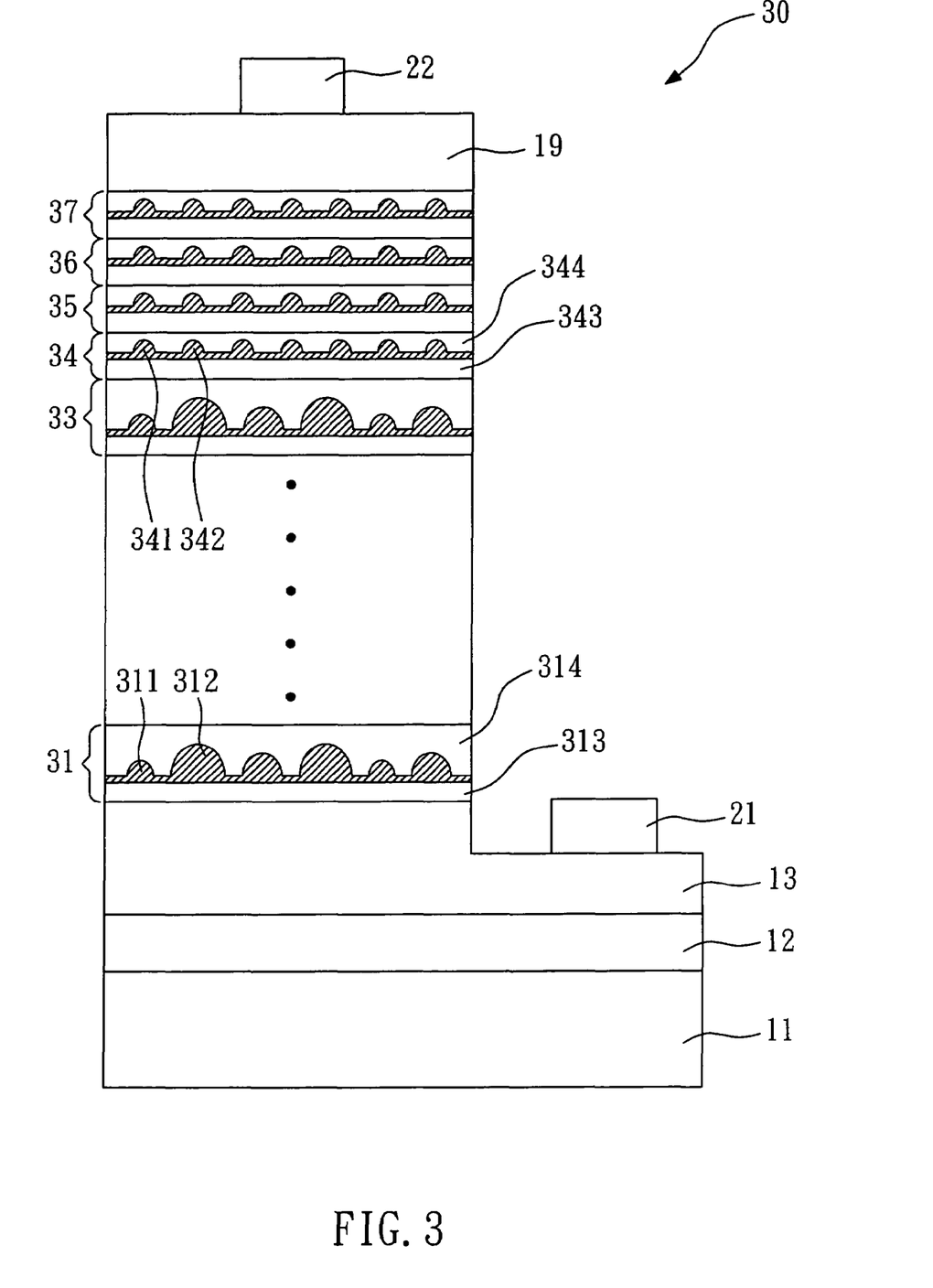
FIG. 3 is a schematic view illustrating the laminar structure of a single-chip white light emitting device according to a second embodiment of this invention.

FIG. 3 is a schematic view illustrating the laminar structure of a single-chip white light emitting device 30 according to a second embodiment of this invention. In FIG. 3, parts that are of structures identical to those in the first embodiment are designated by the same reference numerals, and serve the same functions if not specifically described.

As shown in FIG. 3, the single-chip white light emitting device 30 according to the second embodiment of this invention is provided between the first and second conductive cladding layers 13, 19 with six broad-spectrum blue-complimentary light quantum dot emitting layers 31, 33 and four blue light quantum dot emitting layers 34, 35, 36, 37. The six broad-spectrum blue-complimentary light quantum dot emitting layers 31, 33 are sequentially disposed over the first conductive cladding layer 13. The broad-spectrum blue-complimentary light quantum dot emitting layers each have plural quantum dots. As exemplified by the broad-spectrum blue-complimentary light quantum dot emitting layer 31, the broad-spectrum blue-complimentary light quantum dot emitting layer 31 includes plural quantum dots 311, 312 and two barrier layers 313, 314, where each layer includes quantum dots of different dimensions to result in an uneven character distribution of the quantum dots, so as to increase FWHM of the emission wavelength of the quantum dot emitting layers 31, 33.

The broad-spectrum blue-complimentary light quantum dot emitting layer 33 is disposed thereover with four blue light quantum dot emitting layer 34, 35, 36, 37. As exemplified by the blue light quantum dot emitting layer 34, the blue light quantum dot emitting layer 34 includes plural quantum dots 341, 342 and two barrier layers 343, 344. The quantum dots are not featured with broad-spectrum characteristics as they have similar dimensions. In the laminar structure of the second embodiment, the number of the blue light quantum dot emitting layers may be less than or equal to seven.

Figure 4:
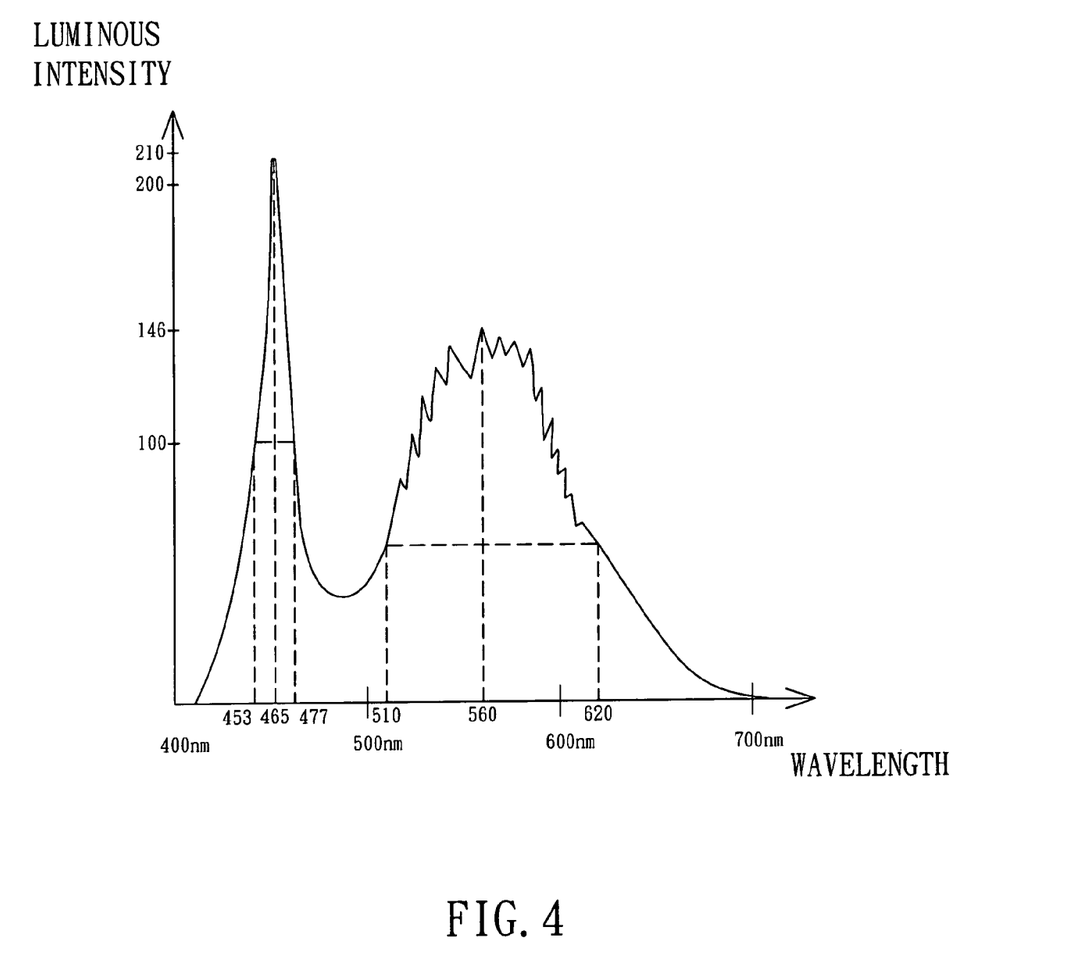
FIG. 4 is a graph illustrating the luminous intensity and bandwidth distribution of the single-chip white light emitting device according to the second embodiment of this invention.

With reference to FIG. 4, the six broad-spectrum blue-complimentary light quantum dot emitting layers are implemented in generating yellow light, where their maximum luminous intensity is manipulated to be 146, their emission wavelength to be 585 nm, and their FWHM (Full Width—Half Maximum, that is, the wavelength bandwidth at an intensity of 0.5) to be 110 nm (510~620 nm) so as to attain a broad-spectrum. On the other hand, the four blue light quantum dot emitting layers each include a maximum luminous intensity of 210, an emission wavelength of 465 nm, and FWHM of 24 nm (453~487 nm), which are not featured with a broad-spectrum.

In the second embodiment for the single-chip white light emitting device of this invention, a single LED laminar structure is provided with broad-spectrum blue-complimentary light quantum dot emitting layers and blue light emitting layers, such that mixing of the two would attain an $Al_{(1-x-y)}In_yGa_xN$ single-chip white light emitting devices with a high CRI index, high luminous intensity and would be capable of various color temperature modulation.

Figure 5:
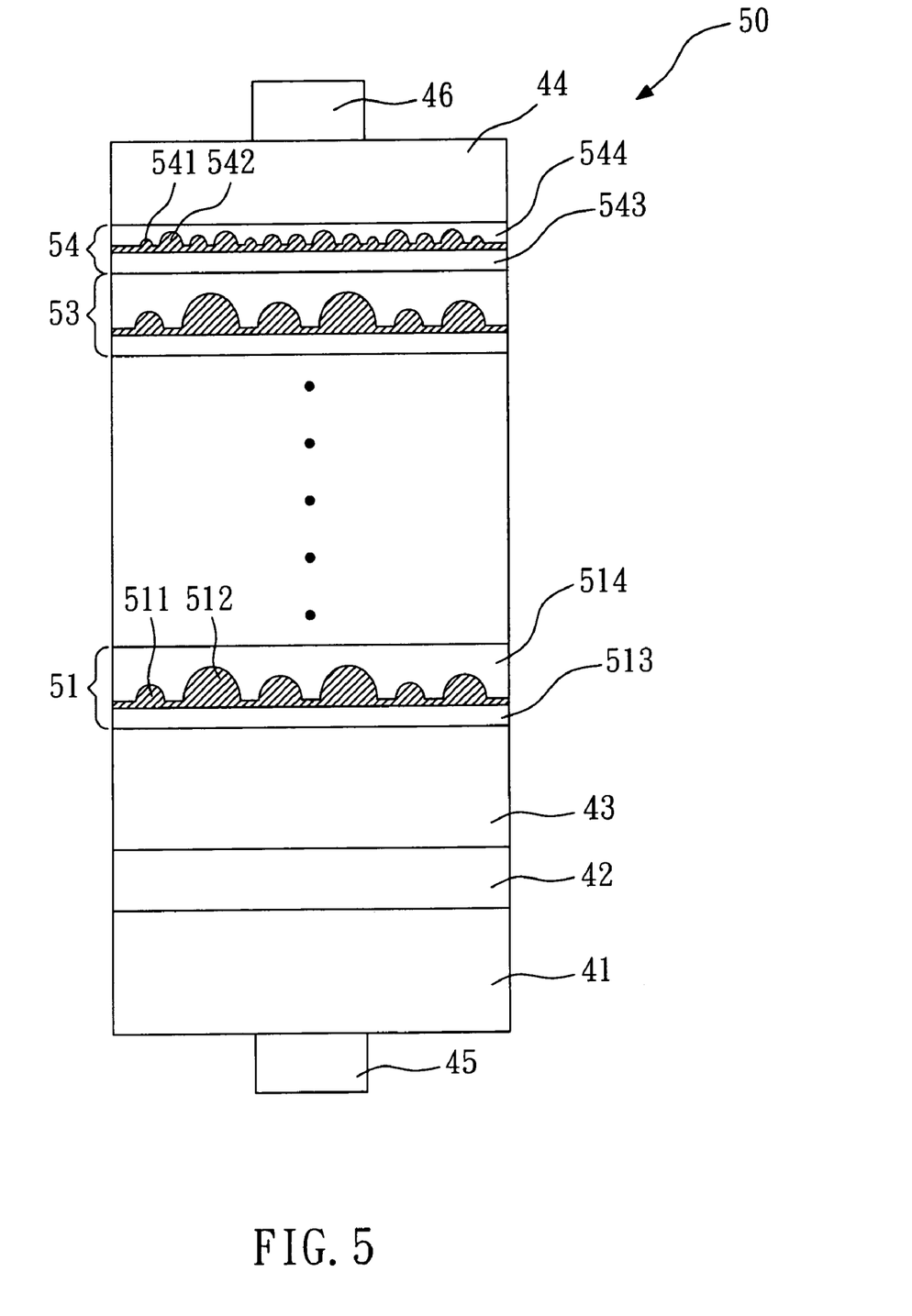
FIG. 5 is a schematic view illustrating the laminar structure of a single-chip white light emitting device according to a third embodiment of this invention.

With reference to FIG. 5, a single-chip white light emitting device 50 according to the third embodiment of this invention is provided between the first and second conductive cladding layers 13, 19 with nine broad-spectrum blue-complimentary light quantum dot emitting layers 51, 53 and a broad-spectrum blue light quantum dot emitting layer 54. The nine broad-spectrum blue-complimentary light quantum dot emitting layers 51, 53 are sequentially disposed over the first conductive cladding layer 13. The broad-spectrum blue-complimentary light quantum dot emitting layers each include plural quantum dots. As exemplified by the broad-spectrum blue-complimentary light quantum dot emitting layer 51, the broad-spectrum blue-complimentary light quantum dot emitting layer 51 includes plural quantum dots 511, 512 and two barrier layers 513, 514, where each layer includes quantum dots of different dimensions to result in an uneven character distribution of the quantum dots, so as to increase FWHM of the emission wavelength of the quantum dot emitting layers 31, 33.

The broad-spectrum blue-complimentary light quantum dot emitting layer 53 is disposed thereover with the broad-spectrum blue light quantum dot emitting layer 54. The broad-spectrum blue light quantum dot emitting layer 54 includes plural quantum dots 541, 542 and two barrier layers 543, 544, where the quantum dots 541, 542 are of different dimensions to result in an uneven character distribution of the quantum dots, so as to increase FWHM of the emission wavelength of the quantum dot emitting layer 54.

The single-chip white light emitting device 50 according to the third embodiment of this invention adopts a laminar structure different from that by the first and second embodiments. In the single-chip device 50, the substrate 41 is a first conductive substrate that may be made of an N-type conductive material, such as: SiC, GaN, and Si. Thus, the substrate 41 may be connected to an electrode 45. It is unnecessary for the electrode 45 to be disposed over the first conductive cladding layer 43 as described in the first and second embodiments. The substrate 41 is disposed thereover with the buffer layer 42 and the first conductive cladding layer 43 sequentially. The second conductive cladding layer 44 is connected to another electrode 46 thereabove.

The substrate of this invention single-chip device may include the first conductive substrate (N-type conductive substrate), and a second conductive substrate or an insulation substrate. The second conductive substrate may be a P-type conductive substrate that is made of SiC, GaN, and Si. The insulation substrate may be one made of $Al_2O_3$, AlN or ZnO.

Figure 6:
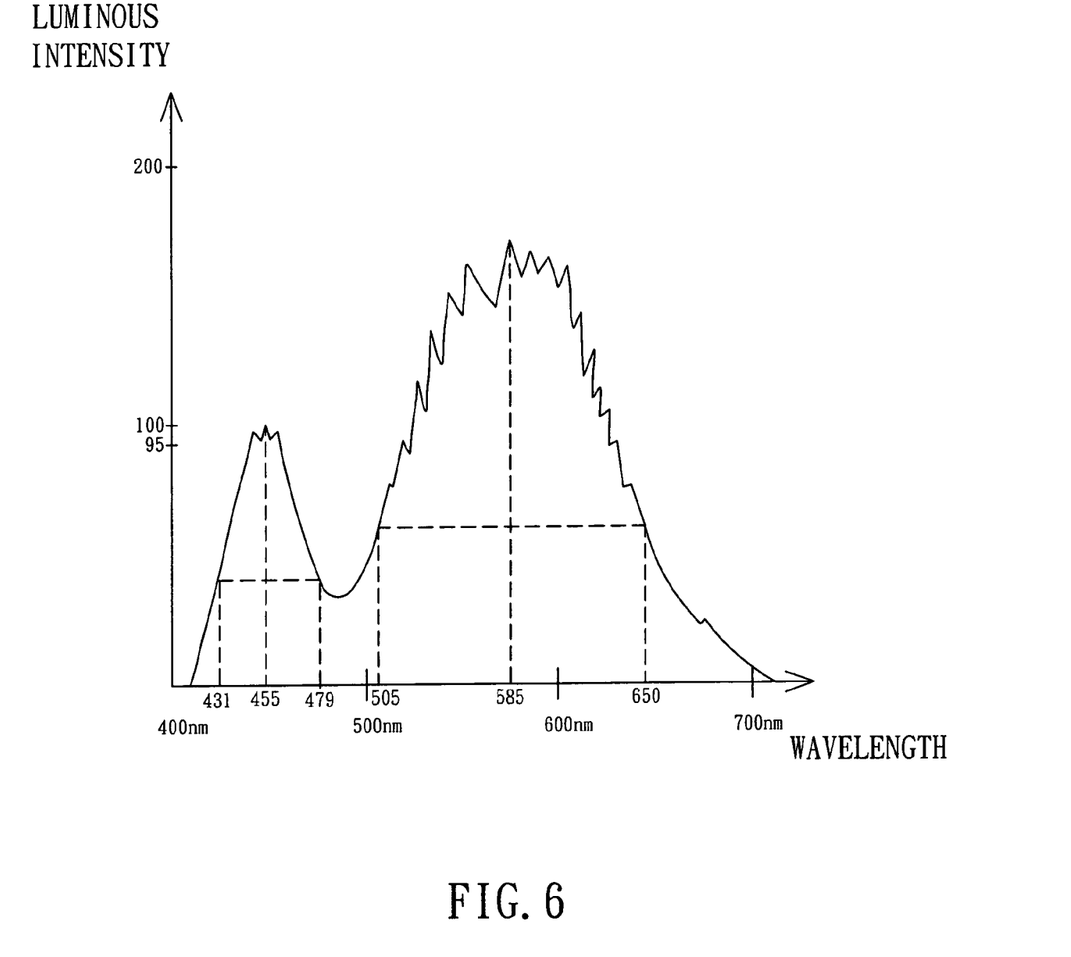
FIG. 6 is a graph illustrating the luminous intensity and bandwidth distribution of the single-chip white light emitting device according to the third embodiment of this invention.

With reference to FIG. 6, the nine broad-spectrum blue-complimentary light quantum dot emitting layers are implemented in generating yellow light, where their maximum luminous intensity is manipulated to be 160, their emission wavelength to be 585 nm, and their FWHM to be 145 nm (505~650 nm) so as to attain a broad-spectrum. At the same time, the blue light quantum dot emitting layer 54 includes an emission wavelength of 455 nm, and FWHM of 48 nm (431~4797 nm), which is also featured with a broad-spectrum.

According to the third embodiment for the single-chip white light emitting device 50 of this invention, the blue light quantum dot emitting layer 54 is featured with a broad-spectrum. Thus, the laminar structure of the single-chip white light emitting device 50 includes both broad-spectrum blue-complimentary light quantum dot emitting layers and broad-spectrum blue light quantum dot emitting layers, such that mixing of the two would attain an $Al_{(1-x-y)}In_yGa_xN$ single-chip white light emitting devices with a high CRI index, high luminous intensity and capable of various color temperature modulation.

Figure 7:
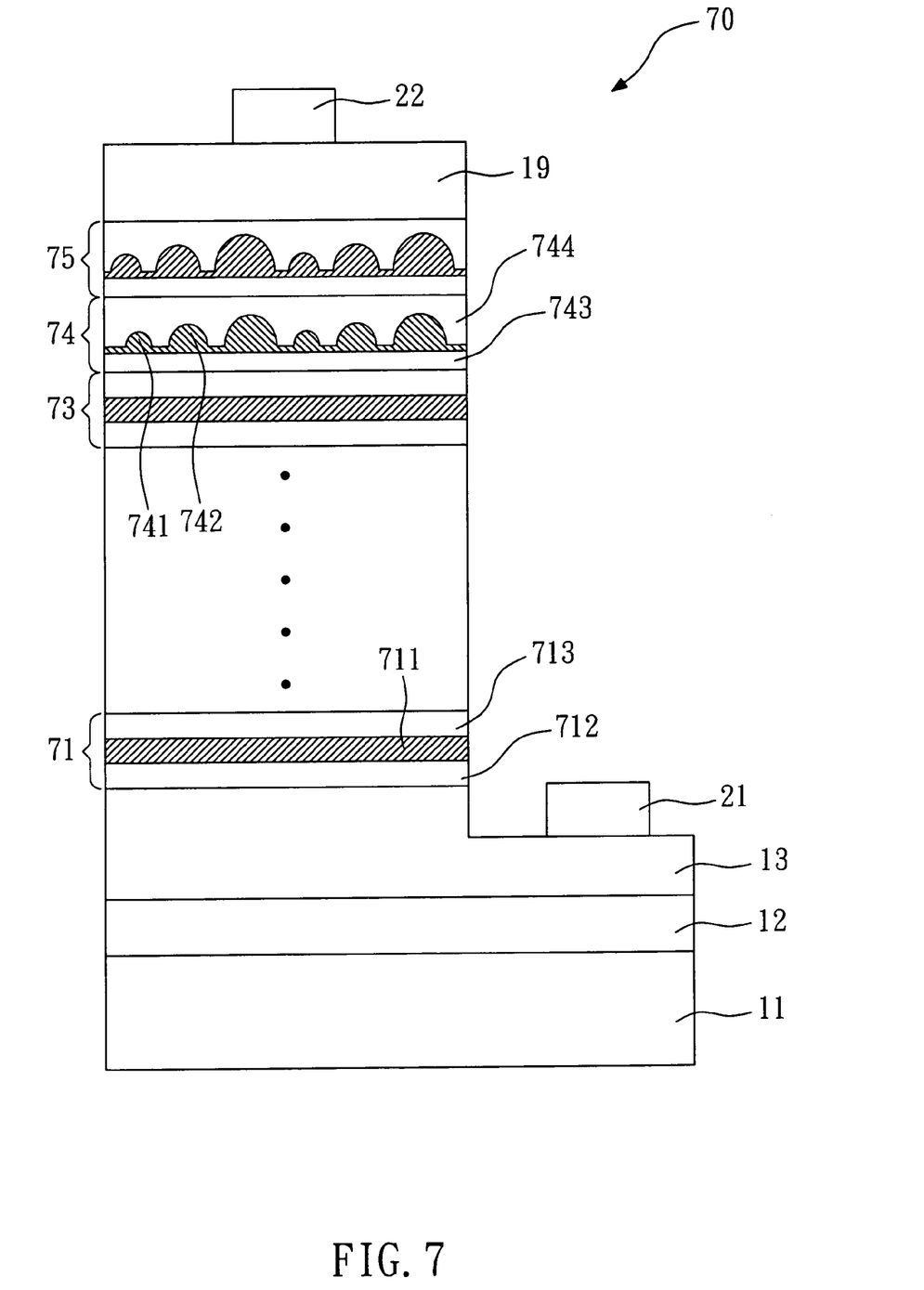
FIG. 7 is a schematic view illustrating the laminar structure of a single-chip white light emitting device according to a fourth embodiment of this invention.

With reference to FIG. 7, a single-chip white light emitting device 70 according to the third embodiment of this invention is provided between the first and second conductive cladding layers 13, 19 with seven blue light quantum well emitting layers 71, 73 and two broad-spectrum blue-complimentary light quantum dot emitting layers 74, 75.

The seven blue light quantum well emitting layers 71, 73 are sequentially disposed over the first conductive cladding layer 13. As exemplified by the blue light quantum well emitting layer 71, the blue light quantum well emitting layer 71 includes a quantum well 711 and two barrier layers 712, 713, where the quantum well is not featured with a broad-spectrum. In the laminar structure of the fourth embodiment, the number of the blue light quantum dot emitting layers may be less than or equal to four.

The blue light quantum well emitting layer 73 is disposed thereover with two sequentially arranged broad-spectrum blue-complimentary light quantum dot emitting layers 74, 75. Similarly, the broad-spectrum blue-complimentary light quantum dot emitting layers each include plural quantum dots. As exemplified by the broad-spectrum blue-complimentary light quantum dot emitting layer 74, the broad-spectrum blue-complimentary light quantum dot emitting layer 74 includes plural quantum dots 741, 742 and two barrier layer 743, 744, where each layer includes quantum dots of different dimensions to result in an uneven character distribution of the quantum dots, so as to increase FWHM of the emission wavelength of the quantum dot emitting layers 74, 75.

Figure 8:
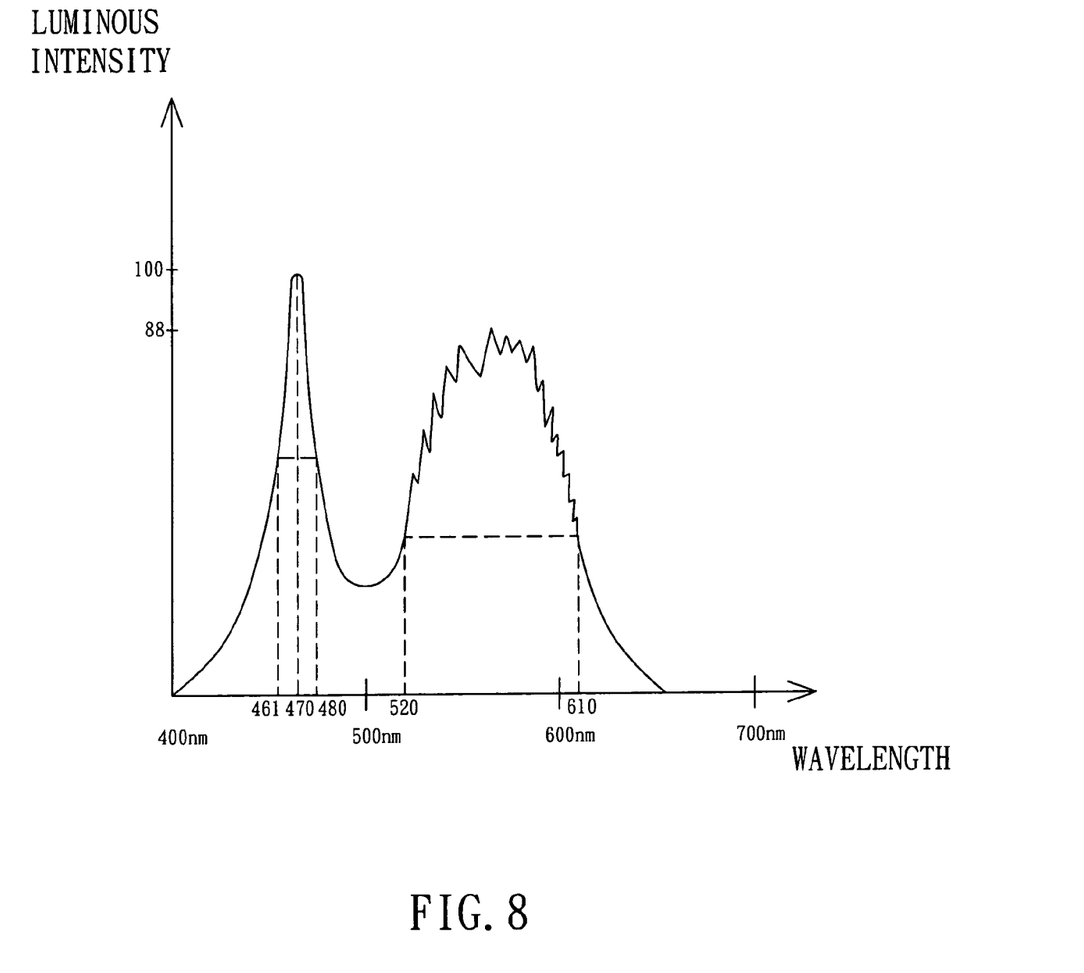
FIG. 8 is a graph illustrating the luminous intensity and bandwidth distribution of the single-chip white light emitting device according to the fourth embodiment of this invention.

With reference to FIG. 8, the two broad-spectrum blue-complimentary light quantum dot emitting layers may be implemented in generating yellow light, where their maximum luminous intensity is manipulated to be 88, their emission wavelength to be 565 nm, and their FWHM to be 90 nm (520~610 nm) so as to attain a broad-spectrum. On the other hand, the seven blue light quantum dot emitting layers each include a maximum luminous intensity of 100, an emission wavelength of 470 nm, and FWHM of 19 nm (461~480 nm), which is not featured with a broad-spectrum.

The single-chip white light emitting device 70 according to the fourth embodiment of this invention adopts a laminar structure different from that by the first to third embodiments. In the single-chip device 70 of the fourth embodiment, the blue light emitting layers adopt a quantum well but not quantum dots. Accordingly, the laminar structure of the single-chip white light emitting device 70 includes both broad-spectrum blue-complimentary light quantum dot emitting layers and blue light quantum well emitting layers, such that mixing of the two would attain an $Al_{(1-x-y)}In_yGa_xN$ single-chip white light emitting devices with a high CRI index, high luminous intensity and would be capable of various color temperature modulation. Thus, the blue light emitting layers of this invention may be ones adopting quantum dots or quantum wells.

Figure 9:
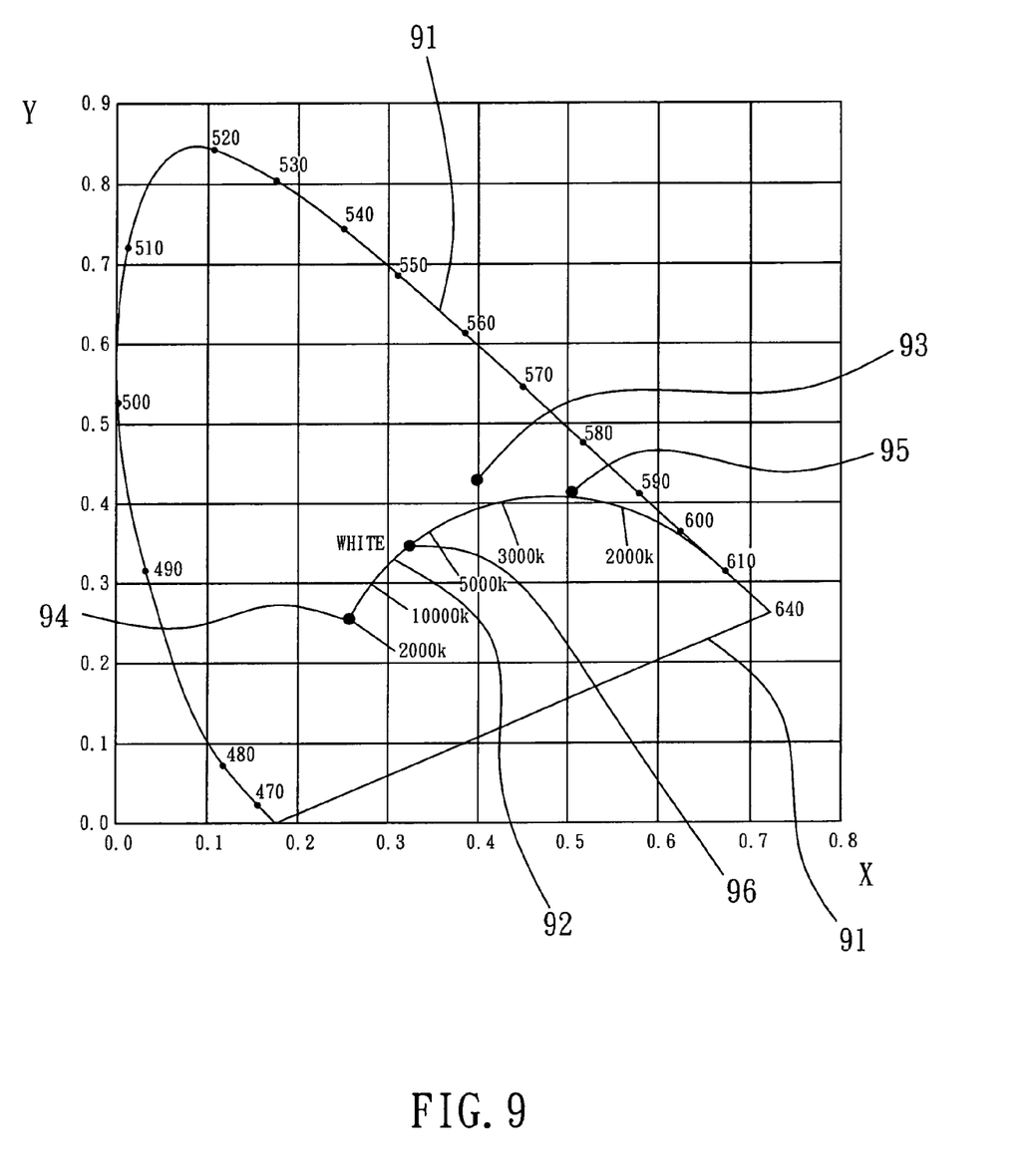
FIG. 9 is a graph illustrating the white light spectrum generated by the solid state white light emitting device according to this invention.

In FIG. 9, Curve 91 illustrates International commission on Illumination (CIE), and Curve 92 illustrates black body locus. A first point 93 represents the white light generated by the single-chip white light emitting device according to the first embodiment, wherein the X-coordinate is 0.4 and the Y-coordinate is 0.43. A second point 94 represents the white light generated by the single-chip white light emitting device according to the second embodiment, wherein the X-coordinate is 0.24 and the Y-coordinate is 0.28. A third point 95 represents the white light generated by the single-chip white light emitting device according to the third embodiment, wherein the X-coordinate is 0.51 and the Y-coordinate is 0.42. A fourth point 96 represents the white light generated by the single-chip white light emitting device according to the fourth embodiment, wherein the X-coordinate is 0.32 and the Y-coordinate is 0.34.

Therefore, the single-chip white light emitting device according to this invention is able to cover an extended range of white light region, with an excellent CRI index, while allowing modulation of the white light into various color temperatures, such as a state of warm color temperature or cold color temperature.

The single-chip white light emitting device of this invention is not limited to the specific number and arrangement of emitting layers as described in the above embodiments. The device may adopt such a laminar structure where a first blue light emitting layer is disposed over the first conductive cladding layer, a second blue light emitting layer is disposed under the second conductive cladding layer, and the broad-spectrum blue-complimentary light quantum dot emitting layer is disposed between the first and second blue light emitting layers. The device may also adopt an alternative laminar structure where a first broad-spectrum blue-complimentary light quantum dot emitting layer is disposed over the first conductive cladding layer, a second broad-spectrum blue-complimentary light quantum dot emitting layer is disposed under the second conductive cladding layer, and the blue light emitting layer is disposed between the first and second broad-spectrum blue-complimentary light quantum dot emitting layers. The device may also adopt yet another laminar structure where the broad-spectrum blue-complimentary light quantum dot emitting layer and blue light emitting layer are alternatively disposed between first and second conductive cladding layers, and the number and sequence of alternative arrangement may be regular or irregular.

In summary, the broad-spectrum blue-complimentary quantum dot emitting layers in the single-chip white light emitting device of this invention may have an emission wavelength at the maximum luminous intensity falling within a range of 510~670 nm, FWHM within a range of 20~200 nm. After packaging with an $Al_{(1-x-y)}In_yGa_xN$ blue light emitting layer in the same chip structure would form a blue LED to form a single-chip white light emitting device with a high CRI index, high luminous intensity, and capable of various color temperature modulation. Since the broad-spectrum emission bandwidth covers the visible spectrum that is most sensitive to human eyes, this invention significantly enhances the luminous intensity of the white light. The distribution of the broad-spectrum also further increases the CRI index and enhances the various color temperature modulation.

Figure 10:
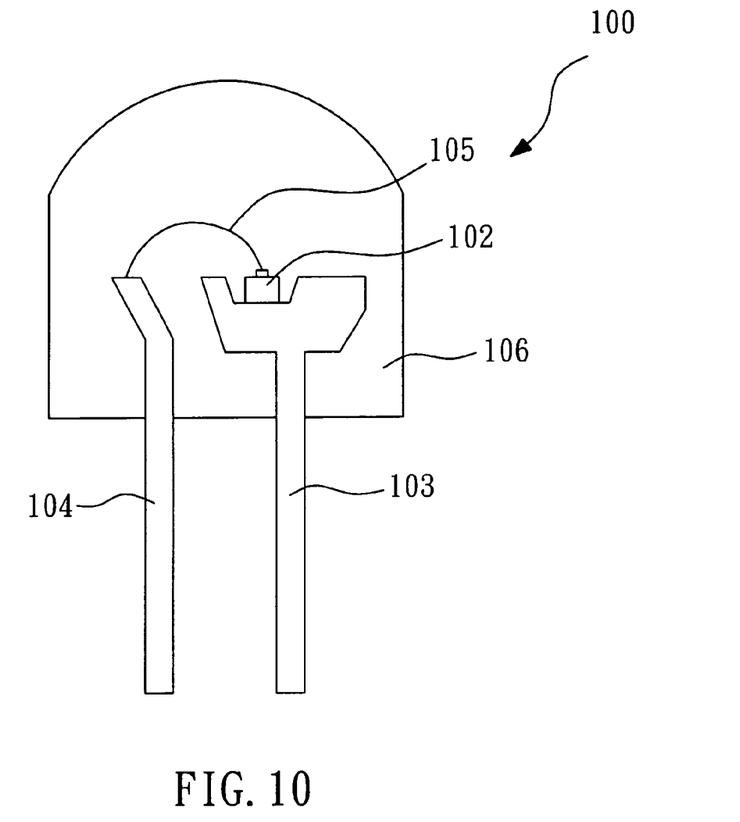
FIG. 10 is a schematic view illustrating the laminar structure of an LED-type single-chip white light emitting device according to this invention.

FIG. 10 is a schematic view illustrating a packaged embodiment of the single-chip white light emitting device according to this invention. The packaged embodiment is an LED-type single-chip white light emitting device 100, comprising: a single-chip white light emitting device 102, a first conductive contact 103, a second conductive contact 104, a lead 105 and a packaging material 106. The single-chip white light emitting device 102 may be any of the single-chip white light emitting devices described above; the single-chip white light emitting device 102 is electrically connected to the first conductive contact 103 via one of the electrodes, and electrically connected to the second conductive contact 104 through the lead 105 via the other electrodes. The device is then packaged by the transparent, insulation packaging material 106 (such as resin epoxy), to attain a single-chip white light emitting device according to this invention.

Figure 11:
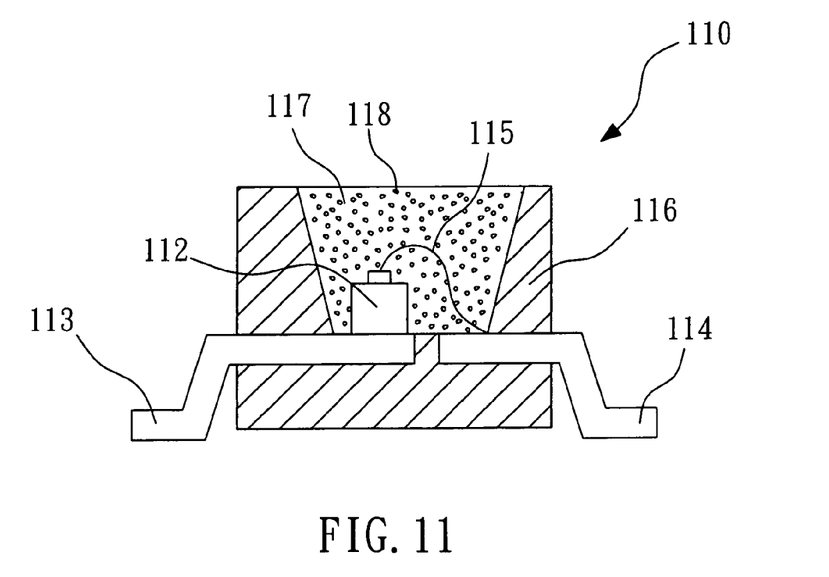
FIG. 11 is a schematic view illustrating the laminar structure of an IC-type single-chip white light emitting device with red fluorescent powder according to this invention.

FIG. 10 is a schematic view illustrating an alternative packaged embodiment of the single-chip white light emitting device according to this invention. The packaged embodiment is an IC-type single-chip white light emitting device 110, comprising: a single-chip white light emitting device 112, a first conductive contact 113, a second conductive contact 114, a lead 115, a base 116, a packaging material 117 and red fluorescent powder 118. The single-chip white light emitting device 112 may be any of the single-chip white light emitting devices described above; the single-chip white light emitting device 112 is electrically connected to the first conductive contact 113 via one of the electrodes, and electrically connected to the second conductive contact 114 through the lead 115 via the other electrode. The base 116 is an opaque insulation material, while the packaging material 117 is a transparent insulation material (such as resin epoxy).

To further enhance the CRI index and the color temperature modulation capability in terms of red light, the single-chip white light emitting device according to this invention may be added with red fluorescent powder 118 of an appropriate amount to be packaged together for attaining a white light emitting device with three wavelength spectrums. Since red light occupies a relatively narrow wavelength spectrum in CIE color modulation, red light has less effect on the overall luminous intensity after mixing. Accordingly, the addition of the red fluorescent powder mainly intends to enhance the weaker color temperature modulation capability and the CRI in the event that white light is subject to red objects. The amount to be added may be less than that for blue-complimentary fluorescent powder that is usually implemented in the prior art. Thus, the high CRI single-chip white light emitting device 110 according to this invention may still be featured with the advantages of high reliability, high luminous intensity, and low packaging cost.

According to this invention, the red fluorescent powder generates red light by absorbing the blue light generated by the blue light emitting layers with a wavelength at the maximum luminous intensity falling within a range of 410~490 nm, or by absorbing the blue-complimentary light generated by the broad-spectrum blue-complimentary light quantum dot emitting layers a wavelength at the maximum luminous intensity falling within a range of 510~670 nm, or by absorbing the blue and blue-complimentary light generated by the blue light emitting layer and the broad-spectrum blue-complimentary light quantum dot emitting layer, respectively. The red fluorescent powder includes a mixture of $LiEuW_2O_8$; CaS: $Eu^{2+}$; SrS: $Eu^{2+}$; $Ba_2Si_5N_8$; $Y_2O_2S$: $Eu^{3+}$, $Bi^{3+}$; $YVO_4$: $Eu^{3+}$, $Bi^{3+}$; and $YVO_4$: $Eu^{3+}$, $Bi^{3+}$.

Figure 12:
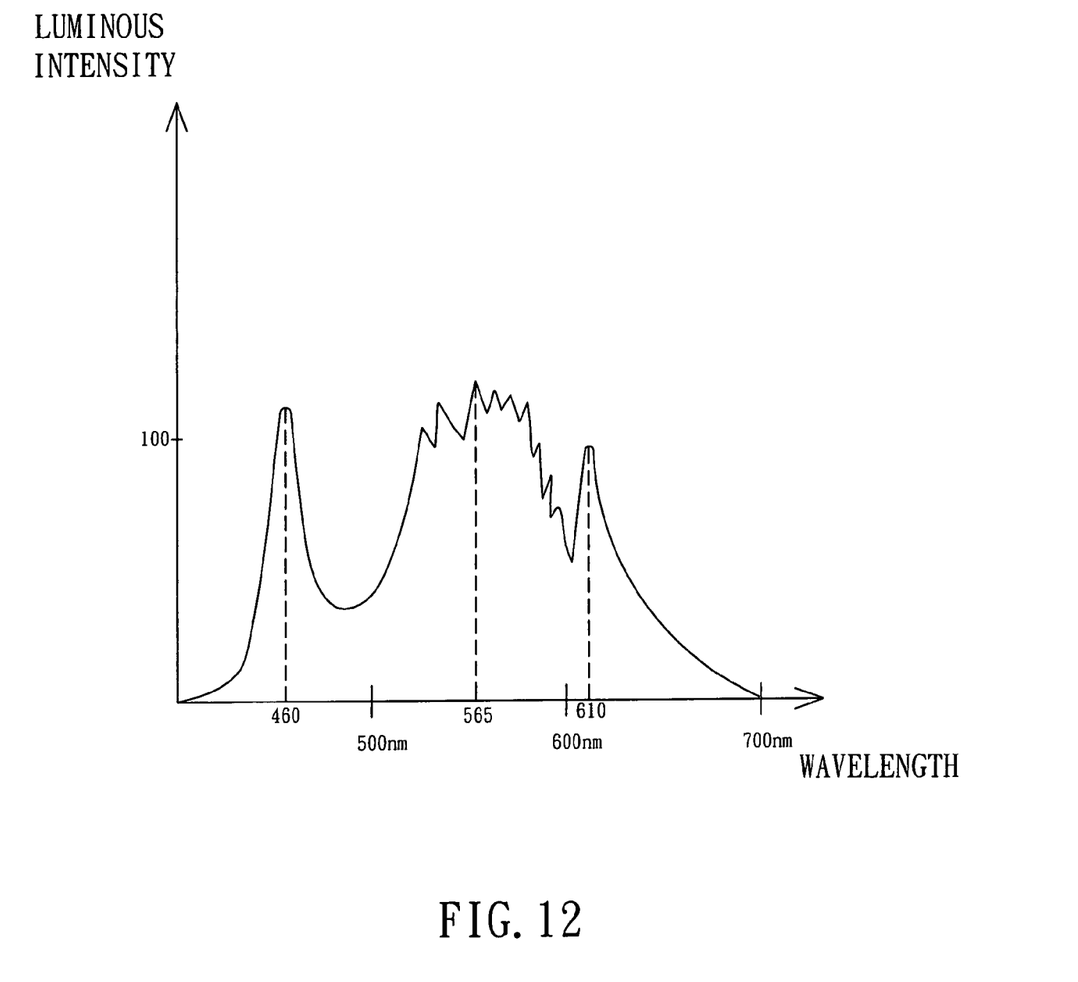
FIG. 12 is a graph illustrating the luminous intensity and bandwidth distribution of the IC-type single-chip white light emitting device with red fluorescent powder according to this invention.

Since human eyes would become drastically less sensitive to the brightness of red light when the wavelength exceeds 620 nm, it is unnecessary for the red light spectrum to feature with a broad-spectrum, as human eyes are most sensitive to light spectrum at 550 nm, where the broad-spectrum would provide a better emission characteristics. Accordingly, this invention adopts fluorescent powder that is capable of generating high-intensity, narrow bandwidth red light to ensure an optimum result, as shown in FIG. 12. Such red fluorescent powder includes a mixture of $Y_2O_2S$: $Eu^{3+}$, $Bi^{3+}$; $YVO_4$: $Eu^{3+}$, $Bi^{3+}$; and $YVO_4$: $Eu^{3+}$, $Bi^{3+}$.

Due to the limitations imposed by the conventional technology of growing $Al_{(1-x-y)}In_yGa_xN$ epitaxy, such limitations are generally observed in term of passing rate that would result in different wavelengths in a single chip. Thus, it is likely that few wavelengths of the single-chip white light emitting device as obtained may slightly deviate from the intended CIE white light spectrum. To improve the passing rate, this invention may further be added with a small amount of blue-complimentary fluorescent powder or a small amount of blue-complimentary fluorescent powder as well as red fluorescent powder into the packaged chip to reduce the defective rate of the single-chip white light emitting devices without effecting the reliability of the single-chip white light emitting devices. The blue-complimentary fluorescent powder includes Yttrium Aluminum Garnet: cerium, gadolinium, samarium, praseodymium, gallium (YAG: Ce, Gd, Sm, Pr, Ga).

As for the packaging process, this invention merely adopts the single-chip packaging process with optional addition of a small amount of red fluorescent powder, a small amount of blue-complimentary fluorescent powder, or a small amount of blue-complimentary fluorescent powder as well as red fluorescent powder. Such a packaging process is simpler as compared with conventional processes, such as coating a blue chip with a large amount of blue-complimentary fluorescent powder, multi-chip packaging by packaging a red, a blue and a green chips, or coating and mixing of read, blue and green fluorescent powder. Thus, the single-chip white light emitting device according to this invention is far superior over that the prior art in terms of reliability, emission efficiency, CRI index, color temperature modulation capability as well as characteristics relating to driving voltage, thermal stability, and ESD impedance characteristics, thereby significantly reducing the packaging cost and enhancing the reliability of the packaged device.

Accordingly, the solid state white light emitting device of this invention may be implemented to serve as or to replace the white light emitting device that is available in the commercial market, such as the white backlight of portable electronic products, vehicular lighting, landscape lighting, decorative lighting, and handheld lighting apparatus.

It is understood that the invention may be embodied in other forms without departing from the spirit thereof. Thus, the present examples and embodiments are to be considered in all respects as illustrative and not restrictive, and the invention is not to be limited to the details given herein.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A single-chip white light emitting device, comprising:
   a substrate;
   a buffer layer, disposed over the substrate;
   a first conductive cladding layer, disposed over the buffer layer;
   a second conductive cladding layer;
   at least one broad-spectrum blue-complimentary light quantum dot emitting layer disposed between the first and second conductive cladding layers, the broad-spectrum blue-complimentary light quantum dot emitting layer having plural quantum dots with an uneven character distribution so as to increase FWHM of emission wavelength of the quantum dot emitting layer; and
   at least one blue light emitting layer, disposed between first and second conductive cladding layers, for generating white light upon mixing of blue light with blue-complimentary light.

2. The single-chip white light emitting device of claim 1, wherein the blue light emitting layer includes a blue light quantum dot emitting layer.

3. The single-chip white light emitting device of claim 1, wherein the blue light emitting layer includes a blue light quantum well emitting layer.

4. The single-chip white light emitting device of claim 1, wherein the blue light emitting layer includes a blue light quantum dot emitting layer, the blue light quantum dot emitting layer having plural quantum dots with an uneven character distribution, so as to increase the FWHM of the emission wavelength of the quantum dot emitting layer.

5. The single-chip white light emitting device of claim 1, wherein the broad-spectrum blue-complimentary light quantum dot emitting layer is disposed over the first conductive cladding layer, and the blue light emitting layer is disposed under the second conductive cladding layer.

6. The single-chip white light emitting device of claim 1, wherein the blue light emitting layers is disposed over the first conductive cladding layer, and the broad-spectrum blue-complimentary light quantum dot emitting layer is disposed under the second conductive cladding layer.

7. The single-chip white light emitting device of claim 1, wherein the substrate is the first conductive substrate.

8. The single-chip white light emitting device of claim 1, wherein the substrate is the second conductive substrate.

9. The single-chip white light emitting device of claim 1, wherein the substrate is an insulation substrate.

10. The single-chip white light emitting device of claim 1, further comprising two electrodes.

11. The single-chip white light emitting device of claim 10, further comprising two conductive contacts and a packaging material, the two conductive contacts being electrically connected to the two electrodes, respectively, the packaging material being a transparent insulation material for packaging the single-chip white light emitting device.

12. The single-chip white light emitting device of claim 11, further comprising a base, the base being an opaque insulation material.

13. The single-chip white light emitting device of claim 11 or 12, further comprising red fluorescent powder added to the packaging material.

14. The single-chip white light emitting device of claim 13, wherein the red fluorescent powder generates red light by absorbing the blue light generated by the blue light emitting layer.

15. The single-chip white light emitting device of claim 13, wherein the red fluorescent powder generates red light by absorbing the blue-complimentary light generated by the broad-spectrum blue-complimentary light quantum dot emitting layer.

16. The single-chip white light emitting device of claim 13, wherein the red fluorescent powder generates red light by absorbing the blue and blue-complimentary light generated by the blue light emitting layer and the broad-spectrum blue-complimentary light quantum dot emitting layer, respectively.

17. The single-chip white light emitting device of claim 13, wherein the red fluorescent powder includes a mixture of $Y_2O_2S$: $Eu^{3+}$, $Bi^{3+}$; $YVO_4$: $Eu^{3+}$, $Bi^{3+}$; and $YVO_4$: $Eu^{3+}$, $Bi^{3+}$.

18. The single-chip white light emitting device of claim 13, wherein the red fluorescent powder includes a mixture of $LiEuW_2O_8$; $CaS$: $Eu^{2+}$; $SrS$: $Eu^{2+}$; $Ba_2Si_5N_8$; $Y_2O_2S$: $Eu^{3+}$, $Bi^{3+}$; $YVO_4$: $Eu^{3+}$, $Bi^{3+}$; and $YVO_4$: $Eu^{3+}$, $Bi^{3+}$.

19. The single-chip white light emitting device of claim 11 or 12, further comprising blue-complimentary fluorescent powder added to the packaging material.

20. The single-chip white light emitting device of claim 19, wherein the blue-complimentary fluorescent powder includes Yttrium Aluminum Garnet: cerium, gadolinium, samarium, praseodymium, gallium (YAG: Ce, Gd, Sm, Pr, Ga).

21. The single-chip white light emitting device of claim 1, wherein a first blue light emitting layers is disposed over the first conductive cladding layer, a second blue light emitting layers is disposed under the second conductive cladding layer, and the broad-spectrum blue-complimentary light quantum dot emitting layer is disposed between the first and second blue light emitting layers.

22. The single-chip white light emitting device of claim 1, wherein a first broad-spectrum blue-complimentary light quantum dot emitting layer is disposed over the first conductive cladding layer, a second broad-spectrum blue-complimentary light quantum dot emitting layer is disposed under the second conductive cladding layer, and the blue light emitting layer is disposed between the first broad-spectrum blue-complimentary light quantum dot emitting layer and the second broad-spectrum blue-complimentary light quantum dot emitting layer.

* * * * *